US 10,454,435 B2

(12) United States Patent
Liu

(10) Patent No.: US 10,454,435 B2
(45) Date of Patent: Oct. 22, 2019

(54) DYNAMIC AMPLIFIER AND CHIP USING THE SAME

(71) Applicant: MEDIATEK INC., Hsin-Chu (TW)

(72) Inventor: Chun-Cheng Liu, Xianxi Township, Changhua County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/830,355

(22) Filed: Dec. 4, 2017

(65) Prior Publication Data

US 2018/0183394 A1    Jun. 28, 2018

Related U.S. Application Data

(60) Provisional application No. 62/439,198, filed on Dec. 27, 2016.

(51) Int. Cl.
*H03F 3/45* (2006.01)
*H03G 3/30* (2006.01)
(Continued)

(52) U.S. Cl.
CPC ....... *H03F 3/45179* (2013.01); *H03F 1/0222* (2013.01); *H03F 3/45183* (2013.01); (Continued)

(58) Field of Classification Search
CPC .... H03F 3/45179; H03F 3/72; H03F 3/45183; H03F 1/0222; H03F 2203/45648; H03F 2203/45634; H03F 2203/45506; H03F 2203/45726; H03F 2200/75; H03F 2200/525; H03F 2200/513; (Continued)

(56) References Cited

U.S. PATENT DOCUMENTS 4,502,019 A    2/1985  Van Roermund
5,124,663 A *  6/1992  McEntarfer ......... H03F 3/45753
                                                330/253
(Continued)

FOREIGN PATENT DOCUMENTS

CN    104242879 A    12/2014
JP    201239548 A    2/2012

OTHER PUBLICATIONS

Forenza, et al.: "Comparator-Based Switched-Capacitor Circuits for Scaled CMOS Technologies"; IEE Journal of Solid-State Circuits, vol. 41, No. 12, Dec. 2006; pp. 2658-2668.
(Continued)

*Primary Examiner* — Khanh V Nguyen
(74) *Attorney, Agent, or Firm* — McClure, Qualey & Rodack, LLP

(57) ABSTRACT

A dynamic amplifier with a bypass design. An input pair of transistors receives a pair of differential inputs Vip and Vin and further provides first, second and third terminals. A load circuit provides a pair of differential outputs Vop and Von with the load circuit connected at a common mode terminal. In an amplification phase, a driver for amplification is coupled to the first terminal and the load circuit is coupled to the second and third terminals. A bypassing circuit is specifically provided. The bypassing circuit is coupled to the second and third terminals during a bypass period within the amplification phase.

23 Claims, 7 Drawing Sheets

(51) Int. Cl.
*H03F 1/02* (2006.01)
*H03F 3/72* (2006.01)

(52) U.S. Cl.
CPC .............. *H03F 3/72* (2013.01); *H03G 3/30* (2013.01); *H03F 2200/297* (2013.01); *H03F 2200/312* (2013.01); *H03F 2200/417* (2013.01); *H03F 2200/421* (2013.01); *H03F 2200/513* (2013.01); *H03F 2200/525* (2013.01); *H03F 2200/75* (2013.01); *H03F 2203/45134* (2013.01); *H03F 2203/45288* (2013.01); *H03F 2203/45506* (2013.01); *H03F 2203/45631* (2013.01); *H03F 2203/45634* (2013.01); *H03F 2203/45641* (2013.01); *H03F 2203/45648* (2013.01); *H03F 2203/45726* (2013.01)

(58) Field of Classification Search
CPC ......... H03F 2200/421; H03F 2200/417; H03F 2200/312; H03F 2203/45134; H03F 2203/45288; H03F 2200/297; H03F 2203/45641; H03F 2203/45631; H03G 3/30
USPC .......................................................... 330/253
See application file for complete search history.

(56) References Cited

U.S. PATENT DOCUMENTS

| | | | | |
|---|---|---|---|---|
| 7,042,384 | B2* | 5/2006 | Shimizu | H03M 1/0602 341/155 |
| 8,049,653 | B2* | 11/2011 | Nakajima | H03F 3/45183 330/256 |
| 8,493,139 | B2* | 7/2013 | Sayuk | H03F 3/45188 330/9 |
| 9,148,098 | B2* | 9/2015 | Kim | H03F 3/45188 |
| 9,520,872 | B2* | 12/2016 | Pandita | H03K 17/687 |
| 2010/0231430 | A1* | 9/2010 | Nakajima | H03F 3/45183 341/155 |
| 2011/0204978 | A1* | 8/2011 | Jansson | H03F 3/45753 330/253 |
| 2012/0313703 | A1 | 12/2012 | Agrawal et al. | |

OTHER PUBLICATIONS

Lin, et al.: "A 0.55 V 7-bit 160 MS/s Interpolated Pipeline ADC Using Dynamic Amplifiers"; 978-1-4673-6146-0/13/$31.00 © 2013 IEEE; pp. 1-4.

Zhang, et al.: "A 91.2dB SNDR 66.2fJ/Conv. dynamic amplifier based 24kHz ΔΣ Modulator"; IEEE Asian Solid-State Circuits Conference, Nov. 7-9, 2016/Toyama, Japan; pp. 317-320.

Malki, et al: "A Complementary Dynamic Residue Amplifier for a 67 dB SNDR 1.36 mW 170 MS/s Pipelined SAR ADC"; 978-1-4799-5696-8/$31.00 © 2014 IEEE; pp. 215-218.

Santosh Prabhu Astgimath: "A low noise, low power dynamic amplier with common mode detect and a low power, low ioise comparator for pipelined SAR-ADC"; Electronics Research Laboratory Faculty of Electrical Engineering, Mathematics and Computer Science; Delft University of Technology; Aug. 2012; pp. 1-96.

Verbruggen, B., et al.; "A 1.7mW 11 b 250MS/s 2× Interleaved Fully Dynamic Pipelined Sar Adc in 40nm Digital CMOS;" IEEE International Solid-State Circuits Conference; Feb. 2012; pp. 466-468.

Van Der Goes, F., et al.; "A 1.5mW 68dB-SNDR 80MS/s 2-times Interleaved SAR-assisted Pipelined ADC in 28nm CMOS;" IEEE International Solid-State Circuits Conference; Feb. 2014; pp. 200-202.

Lin, J., et al.; "A 15.5 dB, Wide Signal Swing, Dynamic Amplifier Using a Common-Mode Voltage Detection Technique;" IEEE; May 2011; pp. 21-24.

Lin, J., et al.; "An Ultra-Low-Voltage 160 MSs 7 Bit Interpolated Pipeline ADC Using Dynamic Amplifiers;" IEEE Journal of Solid-State Circuits; vol. 50; No. 6; Jun. 2015; pp. 1399-1411.

Goes, F. et. al.; "A 1.5mw 68db-sndr 80mss 2-times interleaved pipelined SAR ADC in 28nm CMOS;" IEEE Journal of Solid-State Circuits, vol. 49, No. 12, Dec. 2014; p. 2835-2845.

* cited by examiner

DYNAMIC AMPLIFIER AND CHIP USING THE SAME

CROSS REFERENCE TO RELATED APPLICATIONS

This application claims the benefit of U.S. Provisional Application No. 62/439,198, filed Dec. 27, 2016, the entirety of which is incorporated by reference herein.

BACKGROUND OF THE INVENTION

Field of the Invention

The present invention relates to dynamic amplifiers.

Description of the Related Art

In analog electronics, amplifiers are usually used to increase the power of a signal. To minimize power consumption, dynamic amplifiers operating dynamically are introduced. Dynamic amplifiers do not consume static current when amplification is not required. However, the key limitations of dynamic amplifiers include a narrow signal swing when in low-voltage operation. A dynamic amplifier with wide signal swing is called for.

BRIEF SUMMARY OF THE INVENTION

A dynamic amplifier with bypass design is introduced.

A dynamic amplifier in accordance with an exemplary embodiment of the disclosure includes an input pair of transistors, a load circuit, a driver for amplification and a bypassing circuit. The input pair of transistors receive a pair of differential inputs Vip and Vin and further provides a first terminal, a second terminal and a third terminal. The load circuit provides a pair of differential outputs Vop and Von with the load circuit coupled to a common mode terminal. The bypassing circuit is operative to decrease currents of the load circuit. The driver is coupled to the first terminal in an amplification phase. In the amplification phase, the load circuit is coupled to the second terminal and the third terminal. The bypassing circuit is coupled to the second terminal and the third terminal during a bypass period within the amplification phase. The dynamic amplifier with bypass design provides a high gain.

In an exemplary embodiment, the load circuit includes a pair of load capacitor. The pair of load capacitors provides the pair of differential outputs Vop and Von with the load capacitors connected at the common mode terminal. In the amplification phase, the load capacitors are separately coupled to the second terminal and the third terminal In an exemplary embodiment, the bypassing circuit includes a pair of bypass current sources operative to decrease currents of the load capacitors. The pair of bypass current sources are separately coupled to the second terminal and the third terminal during the bypass period within the amplification phase.

In an exemplary embodiment, the driver for amplification is a current source for amplification which is coupled to the first terminal in the amplification phase.

The bypass current sources may provide variable bypass currents. The bypass period may cover the amplification phase entirely or just partially cover the amplification phase. In some exemplary embodiments, the bypass period is arranged when the amplification phase has been on for a while.

In some exemplary embodiments, sources of the transistors of the input pair are connected at the first terminal, drains of the transistors of the input pair are regarded as the second terminal and the third terminal, and gates of the transistors of the input pair receive the differential inputs Vin and Vip.

The amplification phase may end when a predetermined common mode voltage difference, $\Delta Vcm$, for a common mode voltage of the differential outputs Vop and Von is achieved.

The dynamic amplifier may provides a gain that is equal to $gm \cdot \Delta Vcm / (I_1 - I_2 \cdot Tb/T\_A)$, where gm is the transconductance of each transistor of the input pair, the current source for amplification provides a current of $2 \cdot I_1$, the bypass current sources each provide a bypass current of $I_2$, the amplification phase is T_A long, and the bypass interval is Tb long.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
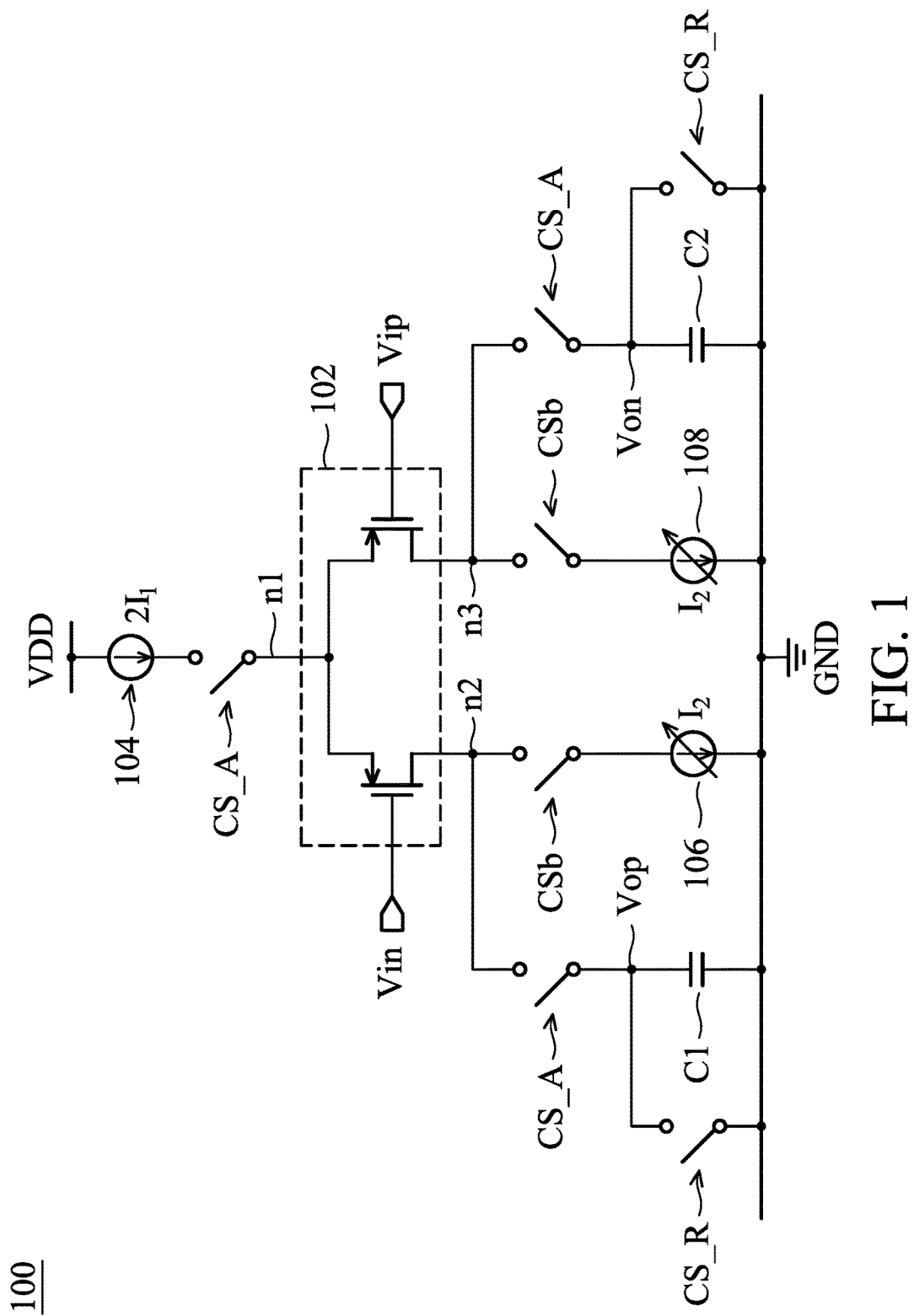
FIG. 1 depicts a dynamic amplifier 100 in accordance with an exemplary embodiment of the disclosure.

FIG. 1 depicts a dynamic amplifier 100 in accordance with an exemplary embodiment of the disclosure, which includes an input pair 102 of transistors and a pair of load capacitors C1 and C2. A pair of differential inputs Vin and Vip are coupled to the dynamic amplifier 100 by the input pair 102 of transistors. The load capacitors C1 and C2 connected at a common mode terminal (GND in this example) are used to present the amplified signal on a pair of differential outputs Vop and Von.

The dynamic amplifier 100 is operated in three phases, including a reset phase, an amplification phase and a sample phase. In the reset phase, the differential outputs Vop and Von are both reset to a predetermined level (short to ground GND in this example). The dynamic amplifier 100 uses a current source 104 to provide a current $2I_1$ for the amplification phase. The current source 104 is coupled to the load capacitors C1 and C2 via the input pair 102 controlled by the differential inputs Vin and Vip. The input pair 102 includes three (connection) terminals n1, n2 and n3. As shown, the sources of the transistors forming the input pair 102 are connected at the connection terminal n1, the drains of the transistors forming the input pair 102 are regarded as the connection terminals n2 and n3, and the gates of the transistors forming the input pair 102 are used to receive the differential inputs Vin and Vip. During the amplification phase, the connection terminal n1 is coupled to the first current source 104 while the connection terminal n2 is coupled to the load capacitor C1 and the connection terminal n3 is coupled to the load capacitor C2. Thus, the voltage levels of the differential outputs Vop and Von change. The amplification phase is ended when a predetermined common mode voltage difference (hereinafter Δ Vcm) is made to a common mode voltage of the differential outputs Vop and Von. The sample phase is provided after the amplification phase to sample the differential outputs Vop and Von.

As shown, a pair of bypass current sources 106 and 108 is specifically provided. The bypass current sources 106 and 108 each are operative to provide a bypass current $I_2$. During a bypass period within the amplification phase, the connection terminals n2 and n3 are coupled to the bypass current sources 106 and 108, respectively and the current flowing through a load capacitor C1/C2 is $(I_1-I_2)$. To achieve the predetermined common mode voltage difference Δ Vcm by the decreased currents, the amplification phase is prolonged and a larger difference is made between the differential outputs Vop and Von. Thus, a larger gain is provided because of the bypass design. The dynamic amplifier 100 has a wide signal swing even in low voltage operation.

Figure 2:
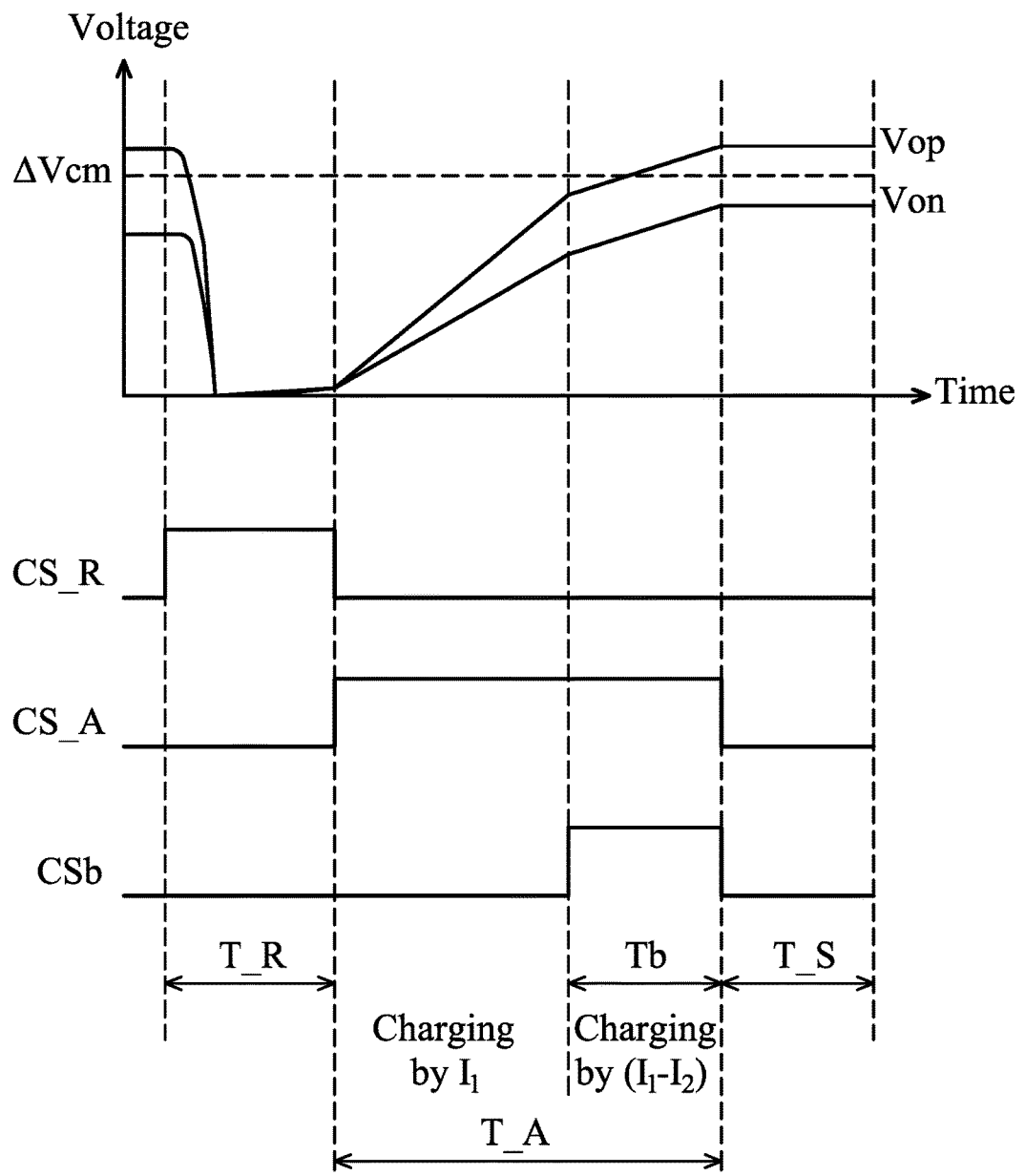
FIG. 2 shows waveforms of the control signals CS_R, CS_A and CSb and depicts the changes of the differential outputs Vop and Von.

In FIG. 1, the switches controlled by the control signal CS_R are turned on in the reset phase, the switches controlled by the control signal CS_A are turned on in the amplification phase, and the switches controlled by the control signal CSb are turned on in the bypass period within the amplification phase. The sample phase is arranged after the enable state of the control signal CS_A. FIG. 2 shows waveforms of the control signals CS_R, CS_A and CSb and depicts the changes of the differential outputs Vop and Von. By the control signal CS_R being enabled during the reset phase T_R, the load capacitors C1 and C2 are discharged and the differential outputs Vop and Von are both reset to the ground level. During the amplification phase T_A, charging currents are provided to charge the load capacitors C1 and C2 and the voltage levels of the differential outputs Vop and Von are raised. Before the bypass period Tb, the charging current for each load capacitor (C1 or C2) is I1. Within the bypass period Tb, the charging current for each load capacitor (C1 or C2) is decreased to $(I_1-I_2)$. The amplification phase T_A ends when the predetermined common mode voltage difference Δ Vcm for the common mode voltage of the differential outputs Vop and Von is achieved. The sample phase T_S is arranged after the amplification phase T_A. The sampling circuit not shown here for the differential outputs Vop and Von may be implemented by any signal sampling design. The gain, G, of the dynamic amplifier 100 is gm·ΔVcm/$(I_1-I_2 \cdot Tb/T\_A)$, where gm is the transconductance of each transistor of the input pair 102. In comparison with a conventional dynamic amplifier providing a gain of gm·ΔVcm/$I_1$ without the bypass design, the dynamic amplifier 100 provides a higher gain by the simple bypass design.

In some exemplary embodiments, the current sources 106 and 108 are variable current sources each providing a variable bypass current $I_2$. In some exemplary embodiments, the bypass period Tb covers the whole amplification phase T_A if a slow charging speed of the load capacitors C1 and C2 is acceptable by the designer. When the bypass period Tb covers the whole amplification phase T_A, the dynamic amplifier 100 has a gain of gm·ΔVcm/$(I_1-I_2)$, which is greater than the limited gain, gm·ΔVcm/$I_1$, provided by a conventional dynamic amplifier.

Figure 3:
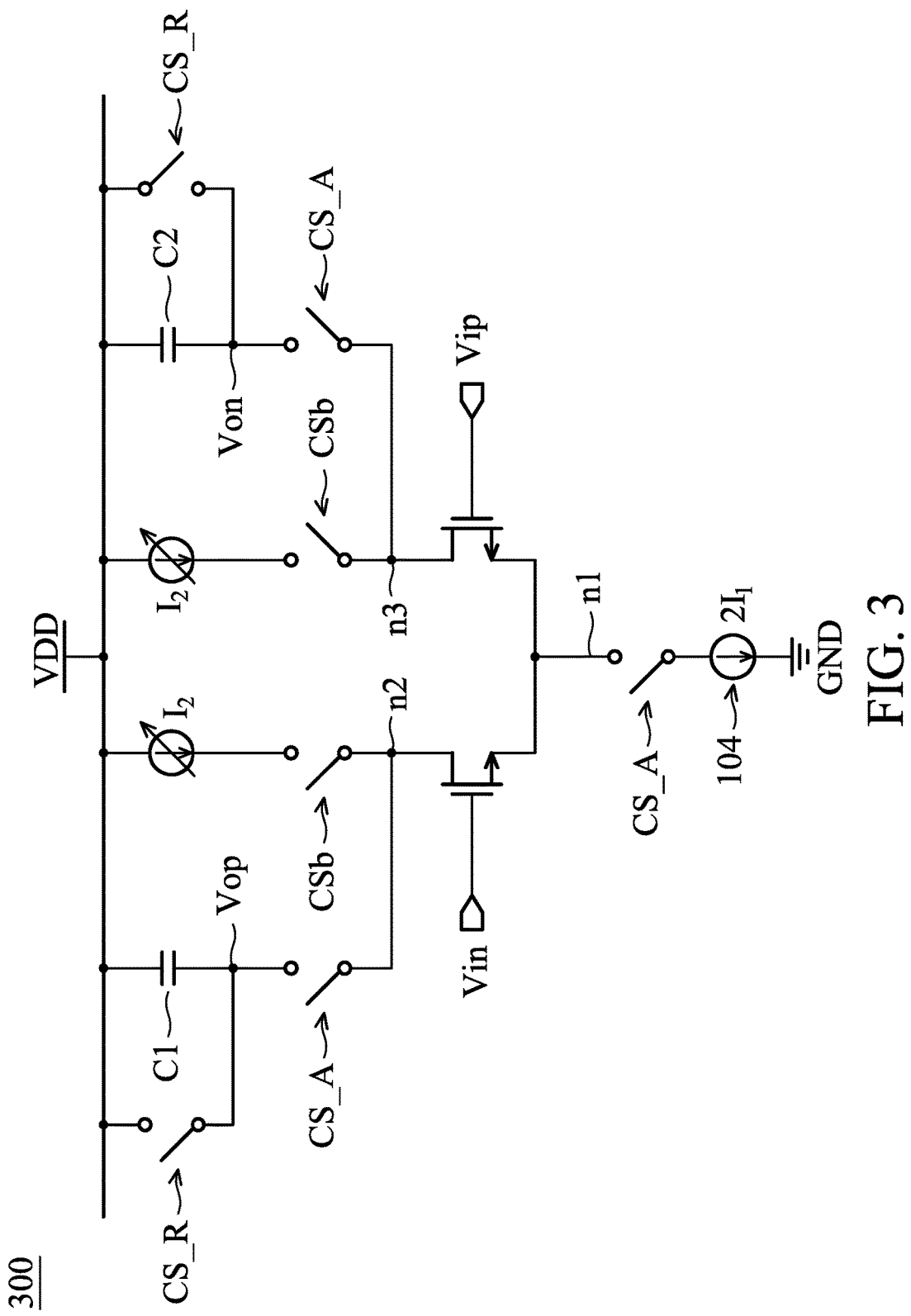
FIG. 3 depicts a dynamic amplifier 300 in accordance with another exemplary embodiment of the disclosure.
Figure 4:
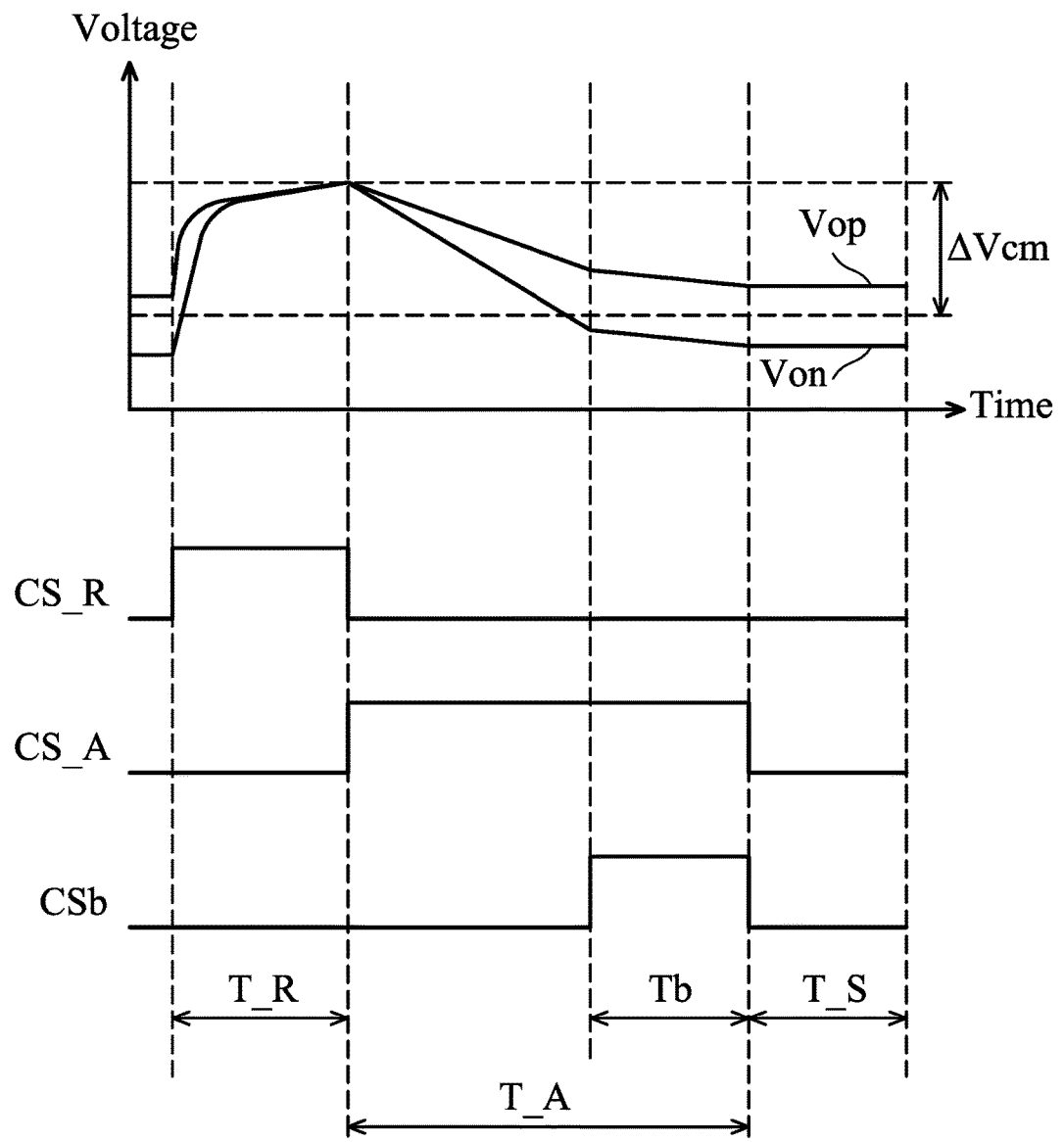
FIG. 4 shows waveforms of the control signals CS_R, CS_A and CSb and depicts the changes of the differential outputs Vop and Von with respect to the dynamic amplifier 300.

FIG. 3 depicts a dynamic amplifier 300 in accordance with another exemplary embodiment of the disclosure. In comparison with the dynamic amplifier 100 of FIG. 1, the common mode terminal connecting the load capacitors C1 and C2 in FIG. 3 is the power source terminal VDD. FIG. 4 shows waveforms of the control signals CS_R, CS_A and CSb and depicts the changes of the differential outputs Vop and Von with respect to the dynamic amplifier 300. By the control signal CS_R being enabled during the reset phase T_R, the differential outputs Vop and Von are both connected to the power source level (also labeled by VDD). During the amplification phase T_A, currents flow through the load capacitors C1 and C2 to charge the load capacitors C1 and C2 and the voltage levels of the differential outputs Vop and Von are pulled down. In the amplification phase T_A, the current flowing through each load capacitor (C1 or C2) before the bypass period Tb is I1. Within the bypass period Tb, the current flowing through each load capacitor (C1 or C2) is decreased to $(I_1-I_2)$. The amplification phase ends when the predetermined common mode voltage difference Δ Vcm for the common mode voltage of the differential outputs Vop and Von is achieved. The sample phase T_S is arranged after the amplification phase T_A. The gain, G, of the dynamic amplifier 300 is effectively improved by the bypass design (referring to the bypass currents $I_2$).

Figure 5:
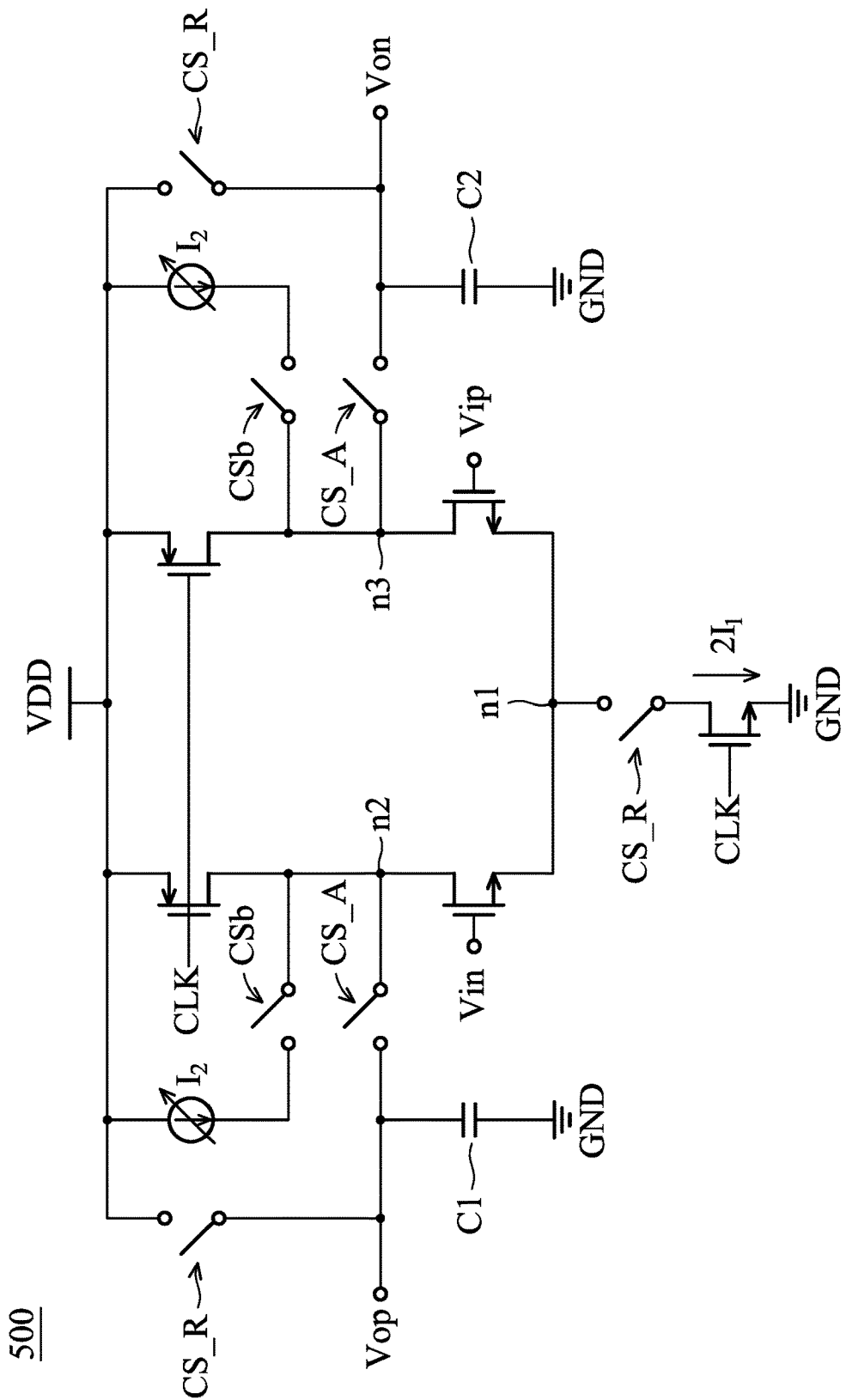
FIG. 5 depicts a dynamic amplifier 500 in accordance with another exemplary embodiment of the disclosure.
Figure 6:
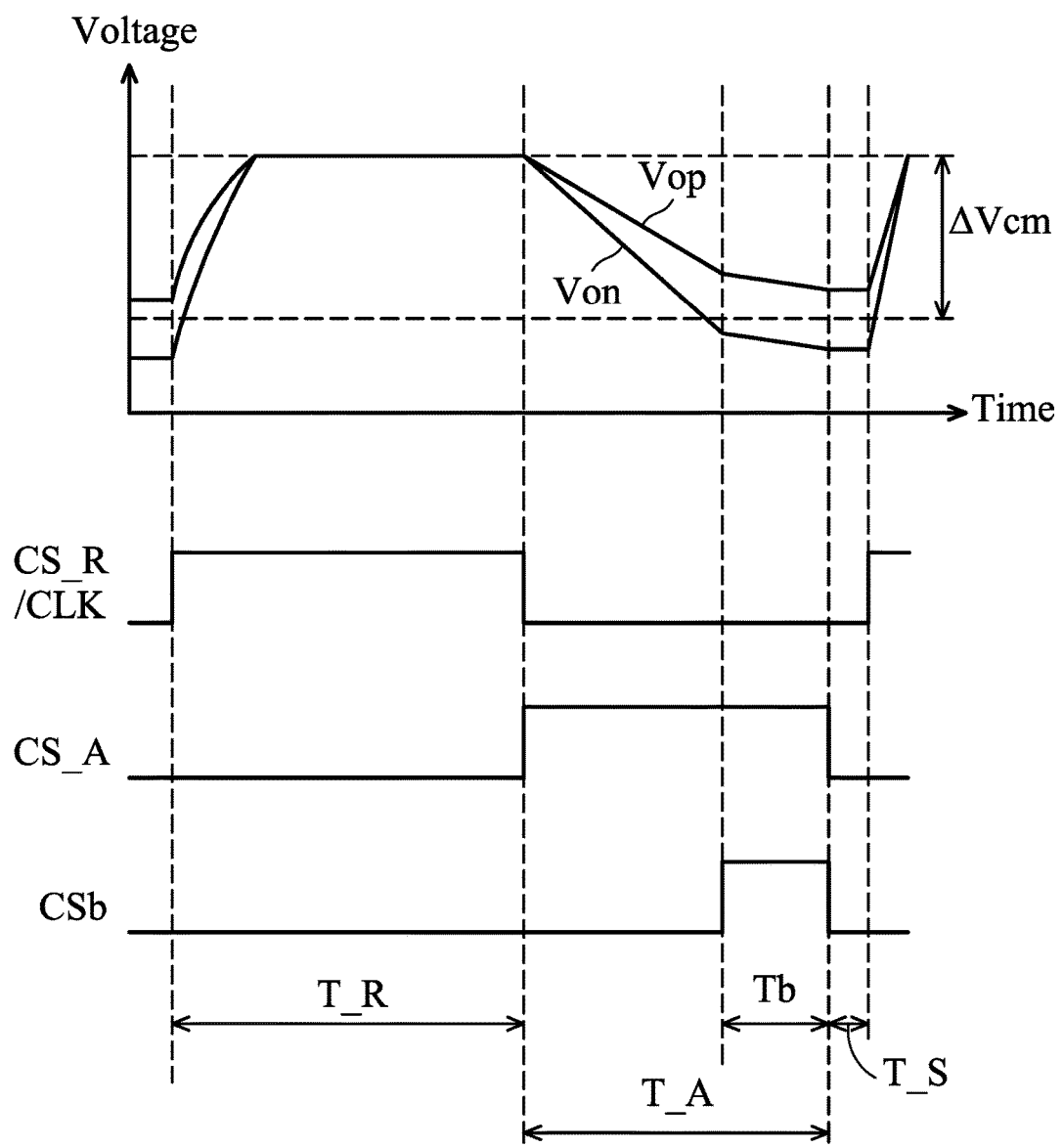
FIG. 6 shows waveforms of the control signals CS_R/CLK, CS_A and CSb and depicts the changes of the differential outputs Vop and Von with respect to the dynamic amplifier 500.

FIG. 5 depicts a dynamic amplifier 500 in accordance with another exemplary embodiment of the disclosure. Instead of being discharged, the load capacitors C1 and C2 connected at a common mode terminal GND are pre-charged in the reset phase and discharged in the amplification phase. FIG. 6 shows waveforms of the control signals CS_R, CS_A and CSb and depicts the changes of the differential outputs Vop and Von with respect to the dynamic amplifier 500. By the control signal CS_R enabled during the reset phase T_R, the load capacitors C1 and C2 are pre-charged and the differential outputs Vop and Von are both connected to the power source level VDD. In the amplification phase T_A, discharging currents are provided to discharge the load capacitors C1 and C2 and the voltage levels of the differential outputs Vop and Von drops. Before the bypass period Tb, the discharging current for each load capacitor (C1 or C2) is $I_1$. In the bypass period Tb, the discharging current for each load capacitor (C1 or C2) is decreased to $(I_1-I_2)$. The amplification phase T_A ends when the predetermined common mode voltage difference Δ Vcm for the common mode voltage of the differential outputs Vop and Von is achieved. The sample phase T_S is arranged after the amplification phase T_A. The gain, G, of the dynamic amplifier 500 is effectively improved by the bypass design (referring to the bypass currents $I_2$).

Any dynamic amplifiers using a bypass design for the pair of load capacitors in the amplification phase are considered within the scope of the disclosure.

Note that the dynamic amplifiers of the disclosure use switch components and connect the common mode connection terminal to VDD or GND to remove the unnecessary static currents.

The pair of load capacitors C1 and C2 forming a load circuit may be replaced by other circuits. Any circuit coupled to the common mode terminal and capable of providing the pair of differential outputs Vop and Von can be used to replace the pair of load capacitors C1 and C2 to form the load circuit.

The current source for amplification (e.g. 104) forming a driver may be replaced by other circuits capable of providing driving capability for signal amplification.

The pair of bypass current sources 106 and 108 forming a bypassing circuit may be replaced by other circuits. Any circuit operative to decrease currents of the load circuit can be used to replace the pair of bypass current sources 106 and 108 to form the bypassing circuit.

Figure 7:
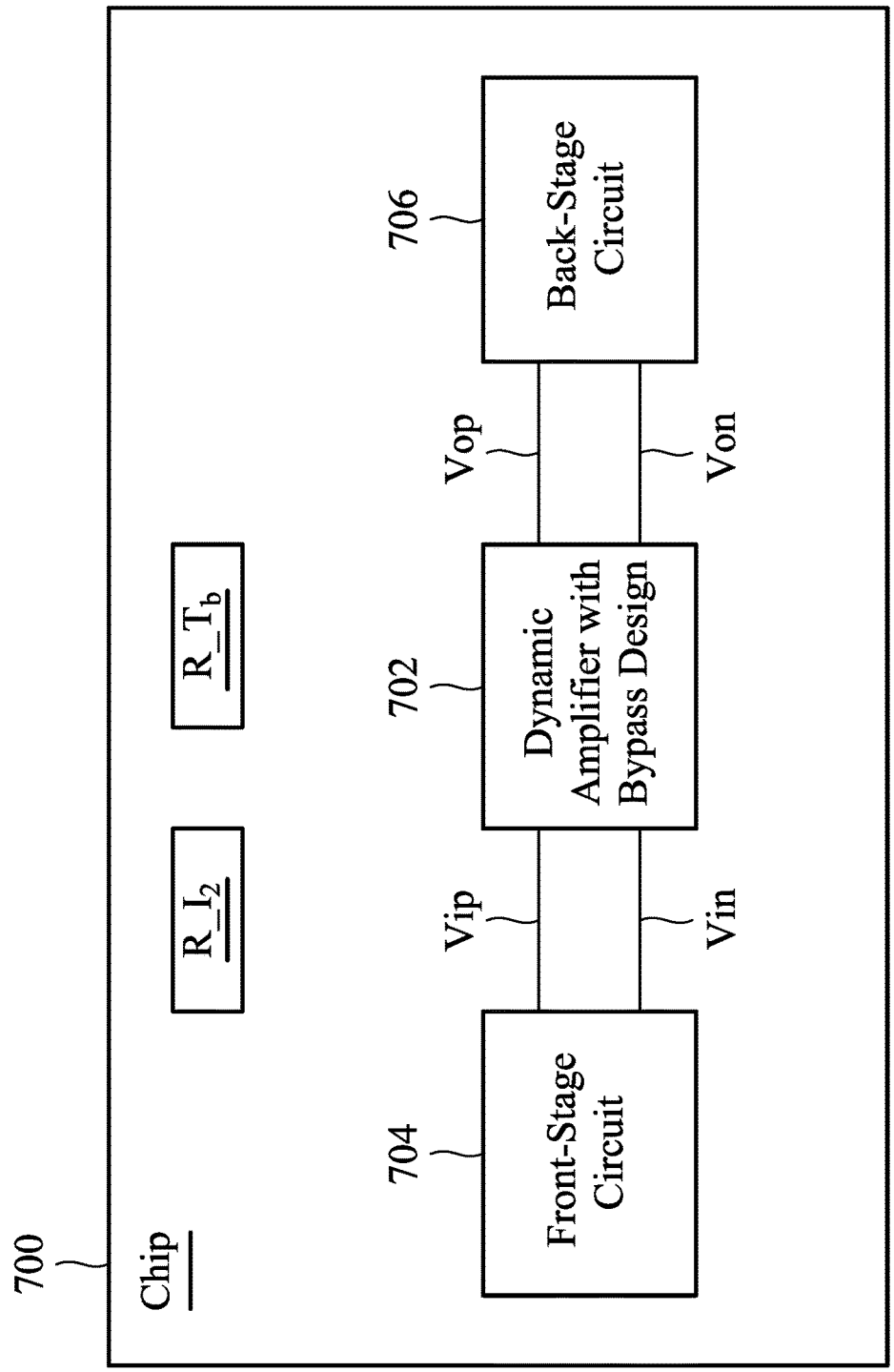
FIG. 7 depicts a chip 700 comprising a dynamic amplifier 702 in accordance with an exemplary embodiment of the disclosure.

FIG. 7 depicts a chip 700 comprising a dynamic amplifier 702 in accordance with an exemplary embodiment of the disclosure. The dynamic amplifier 702 uses the bypass design of the disclosure. The chip 700 further comprises a front-stage circuit 704 and a back-stage circuit 706. The front-stage circuit 704 transmits the differential inputs Vip and Vin to the dynamic amplifier 702. The back-stage circuit 706, receiving the differential outputs Vop and Von from the dynamic amplifier 702.

The chip 700 further comprises a register R_i2 for setting variable bypass currents $I_2$ provided by the bypass current sources of the dynamic amplifier 702. The chip 700 further comprises a register R_Tb for setting the bypass period Tb arranged in the dynamic amplifier 702.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dynamic amplifier, comprising:
    an input pair of transistors, receiving a pair of differential inputs Vip and Vin and further providing a first terminal, a second terminal and a third terminal;
    a load circuit, providing a pair of differential outputs Vop and Von with the load circuit coupled to a common mode terminal;
    a driver for amplification; and
    a bypassing circuit, operative to decrease currents of the load circuit,
    wherein:
    the driver is coupled to the first terminal in an amplification phase;
    in the amplification phase, the load circuit is coupled to the second terminal and the third terminal; and
    the bypassing circuit is coupled to the second terminal and the third terminal during a bypass period within the amplification phase.

2. The dynamic amplifier as claimed in claim 1, wherein:
    the load circuit includes a pair of load capacitors connected at the common mode terminal; and
    in the amplification phase, the load capacitors are separately coupled to the second terminal and the third terminal.

3. The dynamic amplifier as claimed in claim 2, wherein:
    the bypassing circuit includes a pair of bypass current sources operative to decrease currents of the load capacitors; and
    the pair of bypass current sources are separately coupled to the second terminal and the third terminal during the bypass period within the amplification phase.

4. The dynamic amplifier as claimed in claim 3, wherein:
    the driver for amplification is a current source for amplification which is coupled to the first terminal in the amplification phase.

5. The dynamic amplifier as claimed in claim 3, wherein:
    the bypass current sources provide variable bypass currents.

6. The dynamic amplifier as claimed in claim 1, wherein:
    the bypass period covers the amplification phase entirely.

7. The dynamic amplifier as claimed in claim 1, wherein:
    the bypass period just partially covers the amplification phase.

8. The dynamic amplifier as claimed in claim 7, wherein:
    the bypass period is arranged when the amplification phase has been on for a while.

9. The dynamic amplifier as claimed in claim 4, wherein:
    sources of the transistors of the input pair are connected at the first terminal;
    drains of the transistors of the input pair are regarded as the second terminal and the third terminal; and
    gates of the transistors of the input pair receive the differential inputs Vin and Vip.

10. The dynamic amplifier as claimed in claim 9, wherein:
    the amplification phase ends when a predetermined common mode voltage difference, $\Delta Vcm$, for a common mode voltage of the differential outputs Vop and Von is achieved.

11. The dynamic amplifier as claimed in claim 10, providing a gain that is equal to $gm \cdot \Delta Vcm/(I_1 - I_2 \cdot Tb/T\_A)$, where:
    gm is a transconductance of each transistor of the input pair;
    the current source for amplification provides a current of $2 \cdot I_1$;
    the bypass current sources each provide a bypass current of $I_2$;
    the amplification phase is T_A long; and
    the bypass period is Tb long.

12. The dynamic amplifier as claimed in claim 9, wherein:
    the load capacitors are discharged in a reset phase prior to the amplification phase; and
    the load capacitors are charged in the amplification phase.

13. The dynamic amplifier as claimed in claim 12, wherein:
    the common mode terminal is ground; and
    the differential outputs Vop and Von are both pulled down to the ground in the reset phase.

14. The dynamic amplifier as claimed in claim 13, wherein:
    the differential outputs Vop and Von are raised in the amplification phase.

15. The dynamic amplifier as claimed in claim 12, wherein:
    the common mode terminal is a power source terminal; and
    the differential outputs Vop and Von are both connected to the power source terminal in the reset phase.

16. The dynamic amplifier as claimed in claim 15, wherein:
    the differential outputs Vop and Von drop in the amplification phase.

17. The dynamic amplifier as claimed in claim 9, wherein:
the load capacitors are pre-charged in a reset phase prior to the amplification phase; and
the load capacitors are discharged in the amplification phase.

18. The dynamic amplifier as claimed in claim 17, wherein:
the common mode terminal is ground; and
the differential outputs Vop and Von are both connected to a power source terminal in the reset phase.

19. The dynamic amplifier as claimed in claim 18, wherein:
the differential outputs Vop and Von drop in the amplification phase.

20. The dynamic amplifier as claimed in claim 1, wherein:
the differential outputs Vop and Von are sampled in a sample phase after the amplification phase.

21. A chip, comprising:
the dynamic amplifier as claimed in claim 1;
a front-stage circuit, transmitting the differential inputs Vip and Vin to the dynamic amplifier; and
a back-stage circuit, receiving the differential outputs Vop and Von from the dynamic amplifier.

22. The chip as claimed in claim 21, further comprising:
a register for setting a decreased amount of current that the bypassing circuit caused on the load circuit.

23. The chip as claimed in claim 21, further comprising:
a register for arranging the bypass period for the dynamic amplifier.

* * * * *